United States Patent [19]

Shigekane

[11] Patent Number: 4,717,849
[45] Date of Patent: Jan. 5, 1988

[54] SEMICONDUCTOR DEVICE FOR CONDUCTING PRIMARY CURRENT UPON RECEIPT OF A CONTROL SIGNAL

[75] Inventor: Hisao Shigekane, Kanagawa, Japan

[73] Assignee: Fuji Electric Company Ltd., Japan

[21] Appl. No.: 875,076

[22] Filed: Jun. 17, 1986

[30] Foreign Application Priority Data

Jun. 17, 1985 [JP] Japan .................. 60-131295

[51] Int. Cl.$^4$ .............. H03K 17/60; H03K 21/00; G05F 1/573; G06M 1/10
[52] U.S. Cl. .................. 307/570; 307/571; 307/200 B; 307/300; 307/549; 307/572; 307/254; 323/278; 323/289; 377/89; 377/91; 377/33
[58] Field of Search ............ 307/200 B, 300, 542, 307/544, 547, 549, 566, 570, 572, 93, 318, 254; 323/278, 289; 377/89, 91, 33

Primary Examiner—Stanley D. Miller
Assistant Examiner—M. R. Wambach
Attorney, Agent, or Firm—Stevens, Davis, Miller & Mosher

[57] ABSTRACT

A semiconductor device comprising first and second transistors connected in series with one another to provide a path for a primary current upon receipt of a control signal at the gate of the second transistor. The first transistor is coupled to receive a base current from a secondary power source. A third transistor is coupled to have a current path which shunts the base current of the first transistor upon conduction of the third transistor. A zener diode is connected between the base of the third transistor and the common junction of the first and second transistors and is arranged to provide base current to the third transistor thereby causing the third transistor to be conductive upon turn-OFF of the second transistor, and as a consequence quickly turning OFF the first transistor. The base current provided through the zener diode to the third transistor is enhances by spike voltages generated by floating inductance in wiring connecting the first transistor to the second transistor, which enhances conduction of the third transistor upon turn-OFF of the second transistor to facilitate turn-OFF of the first transistor.

10 Claims, 5 Drawing Figures

SEMICONDUCTOR DEVICE FOR CONDUCTING PRIMARY CURRENT UPON RECEIPT OF A CONTROL SIGNAL

BACKGROUND OF THE INVENTION

I. Field of the Invention

The present invention relates to a semiconductor device comprising two transistors having primary current paths connected in series with one another to conduct a primary current through those primary current paths upon receipt of a control signal.

II. Background of the Invention

FIG. 1 illustrates an example of a prior art semiconductor device. The device of FIG. 1 comprises a main bipolar transistor Q1, a field effect transistor (FET) Q2, a zener diode ZD1 and a secondary current source comprising a resistor R1 and a voltage supply $E_B$. As shown in FIG. 1, the emitter of transistor Q1 is connected to the drain of transistor Q2 to thereby couple the primary (collector/emitter) current path of transistor Q1 in series with the primary (drain/source) current path of transistor Q2. The resultant cascade connection of transistors Q1 and Q2 forms an effective composite transistor comprising transistors Q1 and Q2.

As is further shown in FIG. 1, one pole of voltage supply $E_B$ is connected to the source of transistor of Q2, while the other pole is connected to the base of transistor Q1 through resistor R1. In addition, the cathode of zener diode ZD1 is connected to the base of transistor Q1 and the anode of zener diode ZD1 is connected to the source of transistor Q2. The gate of transistor Q2 is coupled to receive a control signal $e_G$.

In operation of the prior art device of FIG. 1, a primary current $I_C$ is applied to the collector of transistor Q1 and passes through the primary (collector/emitter) current path of transistor Q1 and the primary (drain/source) current path of transistor Q2 when both transistors Q1 and Q2 are turned ON. With transistors Q1 and Q2 ON, the primary current $I_C$ may be passed through transistors Q1 and Q2 to a load (not shown) coupled to the source of transistor Q2.

The conduction of transistor Q2 is governed by the state of the control signal $e_G$ applied to the gate of transistor Q2. Control signal $e_G$ is supplied by a drive circuit (not shown) as is well known to those skilled in the art. When control signal $e_G$ is HIGH, transistor Q2 is turned ON. In this condition, a base current $I_{B1}$ is supplied from voltage supply $E_B$ through resistor R1 to the base of transistor Q1, allowing transistor Q1 to also turn ON. To achieve this result, the value of voltage supply $E_B$ must be sufficiently large to drive transistor Q1 ON as transistor Q2 is turned ON by receipt of control signal $e_G$.

As transistor Q2 turns ON, the voltage $V_{DS}$ from the drain to the source of transistor Q2 (plus the base to emitter voltage drop of transistor Q1) drops below the breakdown voltage of zener diode ZD1, permitting all of base current $I_{B1}$ to pass through the base of transistor Q1. When transistor Q2 is OFF, $V_{DS}$ is sufficiently high to cause all of base current $I_{B1}$ to be shunted from power supply $E_B$, through zener diode Z1D, away from the base of transistor Q1. However, the base current $I_{B1}$ to transistor Q1 rises sharply as transistor Q2 is turned ON due to the steep drop of voltage $V_{DS}$, and consequent non-conductance of diode Z1D, when transistor Q2 turns ON. With transistor Q2 ON, zener diode Z1D is in the OFF (non-conductive) state.

Transistors Q1 and Q2 can be turned OFF using the following process. When control signal $e_G$ is LOW, transistor Q2 is turned OFF. Since transistor Q2 is preferably a field effect transistor (FET), transistor Q2 turns OFF quickly, causing voltage $V_{DS}$ between the drain and source of transistor Q2 to rise quickly, thereby quickly turning OFF the primary current $I_C$ flowing through transistor Q2. At the same time $V_{DS}$ rises, zener diode ZD1 becomes conductive, thereby shunting secondary or base current $I_{B1}$ from the base of transistor Q1, through zener diode ZD1, to the source of transistor Q2. With this shunting of base current, accumulated carriers at the base of transistor Q1 are rapidly dissipated to the source of transistor Q2, thereby rapidly turning OFF transistor Q1. As a consequence, both transistors Q1 and Q2 are rapidly turned OFF, thereby ceasing conduction of primary current IC through transistors Q1 and Q2.

The circuit of FIG. 1 is generally intended to obtain high switching speed with high voltage resistance by combining a switching element of high speed, low voltage resistance in the form of FET Q2 and a switching element of high voltage resistance in the form of bipolar transistor Q1. Although the switching speed of FET Q2 is generally greater than that of bipolar transistor Q1, the arrangement of FIG. 2 allows transistor Q1 to also be turned OFF rapidly.

In the circuit of FIG. 1, the zener diode ZD1 is operative because the voltage $V_{DS}$ between the drain and source of transistor Q2 (plus the base to emitter voltage drop of transistor Q1) at the precise moment Q2 turns OFF, assumes a higher voltage than the breakdown voltage or limit voltage for turning ON (switching rejection voltage BDVS) zener diode ZD1. Thus, at essentially the precise moment the primary current through transistor Q2 is turned OFF through operation of transistor Q2, the secondary or effective base current to transistor Q1 is shunted from the base of transistor Q1 through zener diode ZD1, thereby also turning transistor Q1 quickly OFF.

With transistors Q1 and Q2 OFF, the secondary or base current from voltage supply $E_B$ is shunted uselessly through zener diode ZD1 to the source of transistor Q2. On the other hand when transistors Q1 and Q2 are turned on, $V_{DS}$ between the drain and source of FET Q2 (plus the base to emitter voltage drop of transistor Q2) is less than the breakdown or limit voltage for zener diode ZD1 and the secondary or base current from voltage supply $E_B$ is allowed to pass into the base of transistor Q1.

In actual practice of the device of FIG. 1, wiring exists between the emitter of transistor Q1 and the drain of transistor Q2. This wiring exhibits a floating inductance L1 between the emitter E of transistor Q1 and the drain D of transistor Q2. The floating inductance L1 may generate a transitional excess voltage (spike voltage) illustrated by the dotted lines of FIG. 1, resulting in breakdown of transistor Q2. To avoid such breakdown, it is necessary to somewhat delay turning off transistor Q1 until this spike voltage is reduced to a point where breakdown of transistor Q2 can be prevented. However, such delay increases the total switching time of composite transistors Q1, Q2, thereby minimizing the frequency response of the resultant device.

In view of the foregoing, an object of the present invention is to provide a semiconductor device which minimizes the potential negative effect of floating inductance L1.

Additional objects and advantages of the invention will be set forth in the description which follows, and in part will be obvious from the description or may be learned by practice of the invention.

SUMMARY OF THE INVENTION

To achieve the foregoing object, and in accordance with the purpose of the invention as embodied and broadly described herein, a semiconductor device for conducting primary current upon receipt of a control signal is provided which comprises: (a) a first transistor having a control electrode and a primary current path; (b) a second transistor having a control electrode coupled to receive the control signal and having a primary current path coupled in series with the primary current path of the first transistor at a common junction of the first and second transistors, the series primary current paths coupled to receive the before mentioned primary current: (c) a secondary current source coupled to the control electrode of the first transistor: (d) a third transistor having a control electrode and having a current path coupled to shunt the secondary current from the secondary current source away from the control electrode of the first transistor upon conduction of the third transistor; and (e) a zener diode coupled between the control electrode of the third transistor and the common junction of the first and second transistors, this zener diode having a polarity oriented to oppose current flow through the control electrode of the third transistor until the breakdown voltage of the zener diode is exceeded at the common junction of the first and second transistors.

Preferably, the first transistor comprises a bipolar transistor and the second transistor comprises a field effect transistor.

It is still further preferable that a second zener diode is coupled between the control electrode of the third transistor and an end node of the primary current path of the first transistor opposite the common junction of the first and second transistors, the second zener diode having a polarity oriented to oppose current flow through the control electrode of the third transistor until the breakdown voltage of the second zener diode is exceeded at the end node.

It is still further preferable that the semiconductor device of the subject invention include current wiring located between the first and second transistors to couple the primary current paths of the first and second transistors in series, and wherein the before mentioned common junction is located between this current wiring and the primary current path of the second transistor.

DESCRIPTION OF THE PREFERRED EMBODIMENT

Reference will now be made in detail to the present preferred embodiment of the invention as illustrated in the accompanying drawings wherein elements of like type are identified by the same symbolic notations.

Figure 1:
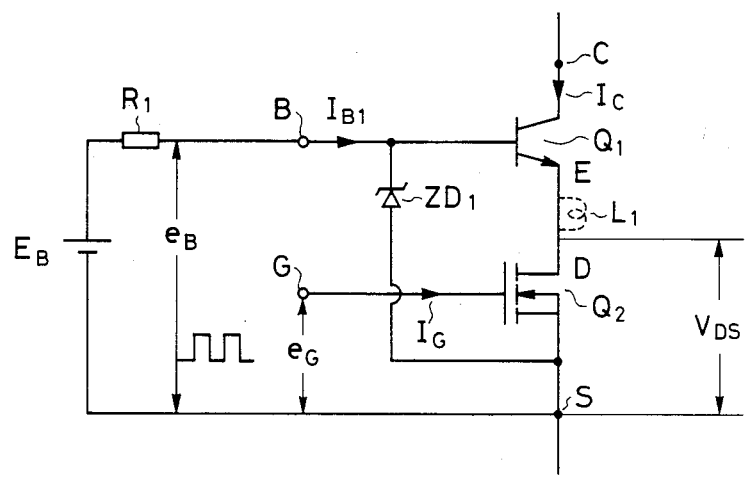
FIG. 1 is a circuit diagram of a prior art semiconductor device for conducting primary current upon receipt of a control signal.
Figure 2:
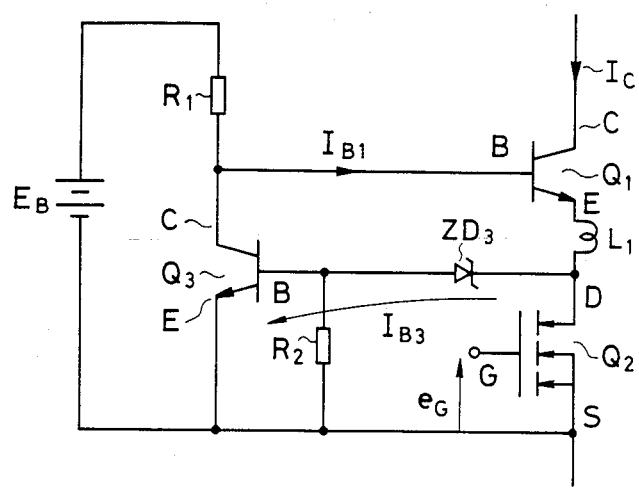
FIG. 2 is a circuit diagram of a semiconductor device for conducting primary current upon receipt of a control signal in accordance with the teachings of the subject invention.

In FIG. 2 there is illustrated a semiconductor device comprising a bipolar transistor Q1, a field effect transistor Q2, a resistor R1, a voltage supply $E_B$, a transistor Q3, a zener diode ZD3, and a resistor R2. Transistor Q1 is preferably a bipolar transistor whereas transistor Q2 is preferably a field effect transistor, although transistor Q2 may, in the alternative, comprise a field effect transistor. Transistors Q1 and Q2 are coupled in the same manner as described above with regard to FIG. 1. Thus, in FIG. 2 a primary current path of transistor Q1 comprising the emitter to base current path of transistor Q1 is coupled in series with the primary current path of transistor Q2 comprising the drain/source current path of transistor Q2. The primary current paths of transistors Q1 and Q2 are coupled together at a common junction point, namely the drain D of transistor Q2. As was also noted above, the emitter of transistor Q1 is coupled to the drain of transistor Q2 through circuit wiring which exhibits a floating inductance L1. The resultant series connected primary current paths of transistors Q1 and Q2 are coupled at collector C of transistor Q1 to receive the primary current $I_C$ which is to be conducted through those primary current paths upon receipt of a suitable control signal $e_G$ at the gate G of transistor Q2.

Voltage supply $E_B$, in combination with resistor R1, provides a secondary current source which is coupled to the control or base electrode of transistor Q1 to provide secondary or base current to transistor Q1.

In accordance with the teachings of the subject invention, a third transistor is provided which has a control electrode and a current path, the current path being coupled to shunt secondary current from the secondary current source away from the control electrode of the first transistor upon conduction of the third transistor. In addition, in accordance with the teachings of the subject invention, a zener diode is provided which is coupled between the control electrode of the third transistor and the common junction of the first and second transistors, this zener diode having a polarity oriented to oppose current flow through the control electrode of the third transistor until the breakdown of the zener diode is exceeded at the common junction of the first and second transistors.

As illustratively provided in FIG. 2, an auxiliary transistor Q3 is illustrated as having a control electrode or base B and a current path comprising a collector (C)/emitter (E) path. The collector transistor Q3 is coupled to the base of transistor Q1 and the emitter of transistor Q3 is connected to the source of transistor Q2. In addition, a zener diode ZD3 is provided having an anode coupled to the base of transistor Q3 and a cathode coupled to the drain of transistor Q2.

In operation the collector/emitter path of transistor Q3 is connected in a direction so as to shunt base current IB1 supplied by voltage supply $E_B$ from the base of transistor Q1 to the source of transistor Q2 upon conduction of transistor Q3. In addition, zener diode ZD3 is connected to have a polarity oriented to oppose current flow from the drain of transistor Q2 through the base of transistor Q3 until the breakdown voltage of zener diode ZD3 is exceeded at the common junction of transistors Q1 and Q2, namely at the drain of transistor Q2.

Transistor Q3 is preferably a field effect transistor (FET) and a resistor R2 is preferably coupled in parallel between the base B of transistor Q3 and the emitter E of transistor Q3.

The cathode of transistor ZD3 is preferably coupled at a point very near the drain D of transistor Q2, at a point where the floating inductance between this connection and the drain D of transistor Q2 is of such small magnitude that this floating inductance can be disregarded. Thus, the majority of any floating conductance between transistors Q1 and Q2 lies between transistor Q1 and the connection of zener diode ZD3 to the common junction of transistors Q1 and Q2.

In addition, the breakdown voltage of zener diode ZD3 is selected to be lower than the maximum drain/source voltage of transistor Q2.

In operation of the device of FIG. 2, transistor Q2 is turned OFF upon receipt of a suitable control signal $e_G$ at the gate G of transistor Q2. As transistor Q2 turns OFF, a base current IB3 is supplied to the base B of transistor Q3 through zener diode ZD3 as a consequence of voltage induced by the floating inductance L1. This current is in such a direction so as to maintain a base current through transistor Q3 sufficient to turn transistor Q3 ON, thereby shunting base current IB1 from voltage source $E_B$, away from base B of transistor Q1, through the collector/emitter current path of transistor Q3 and to the source of transistor Q2. This shunting of base current IB1 turns transistor Q1 off by discharging accumulated carrier at the base of transistor Q1. Thus, transistor Q1 turns OFF shortly after transistor Q2 is turned OFF.

Once the spike voltage from floating inductance L1 subsides and transistor Q1 turns OFF, thereby leaving the drain of transistor Q2 in a floating condition, no additional current is available to the base of transistor Q3 through zener diode ZD3 and transistor Q3 consequently turns OFF. Thus, when transistors Q1 and Q2 are fully OFF, transistor Q3 is also fully OFF thereby avoiding any loss of power from source $E_B$.

In addition to providing rapid turn-OFF of transistors Q1 and Q2 through utilization of the floating inductance L1, the device of FIG. 2 also limits the voltage between drain D and source S of transistor Q2 to the breakdown voltage or zener voltage of zener diode ZD3, thereby further preventing breakdown of transistor Q2. Thus, both transistors Q1 and Q2 may be rapidly turned OFF without resulting in breakdown of transistor Q2 even in the presence of spike voltages induced by floating inductance L1.

Figure 3:
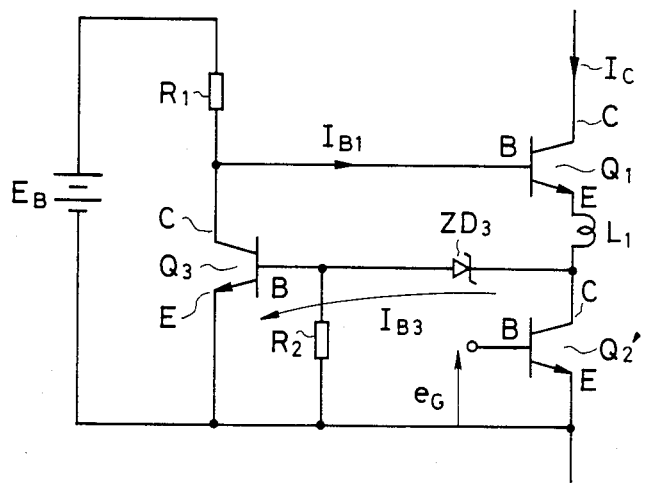
FIG. 3 is a circuit diagram of an alternative embodiment of the circuit illustrated in FIG. 2.

The semiconductor device of FIG. 3 is essentially the same as that of FIG. 2, except that the field effect transistor Q2 of FIG. 2 is replaced in FIG. 3 with a bipolar transistor Q2'.

Figure 4:
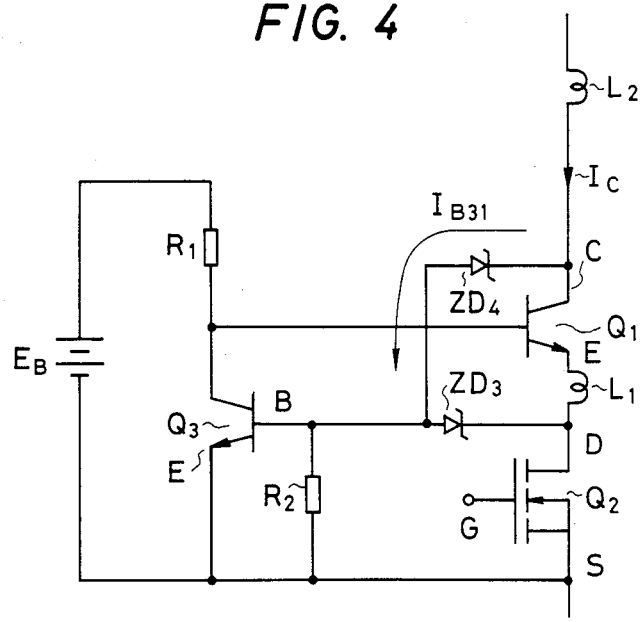
FIG. 4 is a circuit diagram of another semiconductor device for conducting primary current upon receipt of a control signal incorporating the teachings of the subject invention.

The device illustrated in the circuit of FIG. 4 is essentially identical to the device illustrated in the circuit of FIG. 2, except for the inclusion of an additional zener diode ZD4 coupled between the collector of transistor Q1 and the base of transistor Q3. Thus, zener diode ZD4 is coupled between the control electrode of transistor Q3 and an end node (collector C) of the primary current path (collector/emitter current path) of transistor Q1 opposite the common junction (drain D) of transistors Q1 and Q2. Zener diode ZD4 has a polarity oriented to oppose current flow from the collector of transistor Q1 into the base of transistor Q3 until the breakdown voltage of zener diode ZD4 is exceeded at collector C of transistor Q1. Specifically, the anode of zener diode ZD4 is connected to the base of transistor Q3 and the cathode of zener diode ZD4 is connected to the collector C of transistor Q1.

The resultant device of the circuit illustrated in FIG. 4 permits voltage induced in a floating inductance L2 of an external line connected to collector C of transistor Q1 to be absorbed by transistor Q3 and resistor R2 when transistor Q1 turns OFF. Specifically, zener diode ZD4 is connected at a point very near the collector C of transistor Q1, namely at a point where the floating inductance between this connection point and the collector C of transistor Q1 can be disregarded. In addition, the breakdown or zener voltage of zener diode ZD4, as noted above, is set lower than the maximum collector (c)/source (s) voltage which can be allowed by the series connection of composite transistors Q1 and Q2.

In the device of FIG. 4, when transistor Q1 turns OFF, a base current IB31 is supplied to base B of transistor Q3 through zener diode ZD4 as a consequence of voltage induced by floating inductance L2. The resultant current is in such a direction as to trigger transistor Q3 ON upon turn-off of transistor Q1, thereby enhancing the speed of turn-off of transistors Q1 and Q2. In addition, the collector/emitter voltage of transistor Q1 is kept below a maximum value dictated by the selected breakdown voltage of zener diode ZD4, thereby tending to prevent the breakdown of transistor Q1.

As noted above, the base current available to transistor Q3 through zener diodes ZD3 ceases to be available when the drain D of transistor Q2 is left in a floating condition due to nonconductance of transistor Q1. In this condition, transistor Q3 would necessarily turn OFF. However, base current might be available to transistor Q3 even with transistors Q1 and Q2 turned OFF dependent upon the relative value of the breakdown voltage of zener diode ZD4 and the voltage available at the collector of transistor Q1 when both transistors Q1 and Q2 are turned OFF. To assure the transistor Q3 is turned OFF when transistors Q1 and Q2 are also fully OFF, the breakdown voltage of zener diode ZD4 should be chosen greater than the ambient voltage at the collector C of transistor Q1 when both transistors Q1 and Q2 are turned OFF but less than the spike voltage available at the collector of transistor Q1 immediately upon turn-OFF of transistor Q1. Thus, the spike voltage may be passed from zener diode ZD4 to the base of transistor Q3 upon turn-OFF of transistor Q1 and yet transistor Q3 may be turned OFF after the spike voltage has passed and transistors Q1 and Q2 are OFF.

Figure 5:
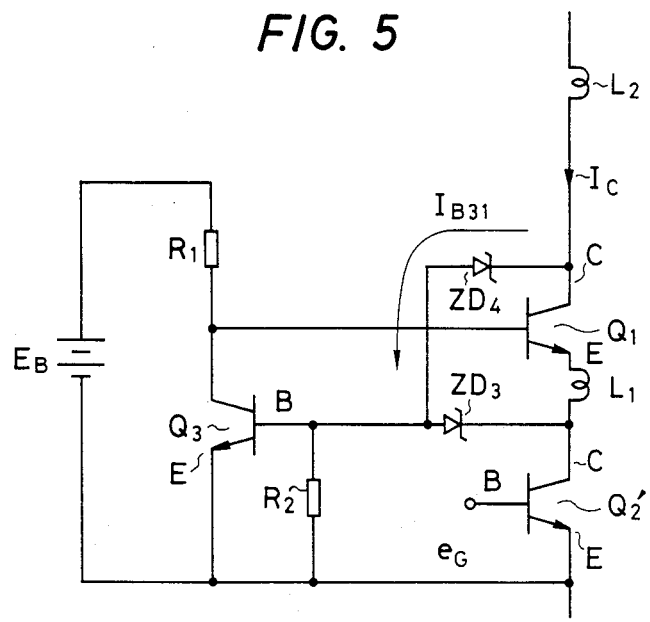
FIG. 5 is an alternative embodiment of the semiconductor device illustrated in FIG. 4.

The transistor Q2 of both FIGS. 2 and 4 may be a low voltage resistance bipolar transistor instead of a field effect transistor, as indicated by transistor Q2' in FIG. 5.

According to the above description of the present invention, a semiconductor device is provided wherein a first bipolar transistor and a second field effect (or bipolar) transistor are cascade-connected together while the emitter of the first transistor and the drain (collector) of the second transistor are coupled together, and the collector/emitter (drain source) of a third bipolar or field effect transistor are connected between the base of the first transistor and the source (emitter) of the second transistor in such a polarity so as to shunt base current of the first transistor upon conduction of the third transistor, and a zener diode is connected between the drain (collector) of the second transistor and the base (gate) of the third transistor in such a polarity so as to reject base current (gate voltage) of the third transistor until the breakdown voltage of that zener diode is exceeded.

Given the teachings of the present invention, a semiconductor device is provided such that when the device turns OFF, a spike voltage generated by the floating inductance of the main circuit wiring between the first and second transistors reaches the base (gate) of the third transistor through the zener diode. In addition, the drain/source (collector/emitter) voltage of the second transistor is limited to approximately the breakdown or zener voltage of the zener diode, thereby preventing breakdown of the second transistor. Thus, the floating inductance between the first and second transistors can effectively be utilized to turn the composite transistor of the subject invention OFF.

As a consequence of the foregoing, the semiconductor device of the subject invention is adopted for high frequency circuit operation because the turn-OFF time of the second transistor, and thereby the switching time of the resultant composite transistor, need not be delayed in order to protect the second transistor from floating inductance induced spike voltages.

I claim:

1. A semiconductor device for conducting primary current upon receipt of a control signal, comprising:
   (a) a first transistor having a control electrode and a primary current path;
   (b) a second transistor having a control electrode coupled to receive said control W signal and having a primary current path coupled in series with said primary current path of said first transistor, said series current paths including a common junction between said first and second transistors, the resultant series connected primary current paths being coupled to receive said primary current;
   (c) a secondary current source for providing a secondary current coupled to said control electrode of said first transistor;
   (d) a third transistor having a control electrode and having a current path coupled to said secondary current source to conduct said secondary current from said control electrode of said first transistor upon conduction of said third transistor; and
   (e) a zener diode coupled between said control electrode of the said third transistor and the common junction of said first and second transistors, said zener diode having a polarity oriented to oppose current flow through said control electrode of said third transistor until the breakdown voltage of said zener diode is exceeded at said common junction of said first and second transistors.

2. A semiconductor device of claim 1 further including a second zener diode coupled between said control electrode of said third transistor and an end node of said primary current path of said first transistor opposite said common junction of said first and second transistors, said second zener diode having a polarity oriented to oppose current flowing to said control electrode of said third transistor until the breakdown voltage of said second zener diode is exceeded at said end node.

3. The semiconductor device of claim 1 further including circuit wiring located between said first and second transistors to couple said primary current paths of said first and second transistors in series with one another, and wherein said common junction is located between said circuit wiring and said primary current path of said second transistor.

4. A semiconductor device of claim 1 wherein said first transistor comprises a bipolar transistor.

5. A semiconductor device of claim 4 wherein said second transistor comprises a field effect transistor.

6. A semiconductor device of claim 4 wherein said second transistor comprises a bipolar transistor.

7. A semiconductor device for conducting primary current upon receipt of a control signal comprising:
   (a) a first bipolar transistor having a collector, emitter and base;
   (b) a second field effect transistor having a gate coupled to receive said control signal and having a drain and source, said drain of said second transistor coupled to said emitter of said first transistor and said collector of said first transistor coupled to receive said primary current;
   (c) a secondary current source coupled to said base of said first transistor;
   (d) a third bipolar transistor having a base collector and emitter, said collector connected to the base of said first transistor and said emitter connected to the source of said second transistor; and
   (e) a zener diode having an anode coupled to the base of said third transistor and a cathode coupled to the drain of said second transistor, said zener diode having a breakdown voltage selected to be exceeded by the drain to source voltage of said second transistor immediately upon turn-off of said second transistor by said control signal.

8. A semiconductor device of claim 7 further comprising a second zener diode having a cathode coupled to the collector of said first transistor and having an anode coupled to the base of said third transistor.

9. A semiconductor device for conducting primary current upon receipt of a control signal comprising:
   (a) a first bipolar transistor having a collector, emitter and base;
   (b) a second bipolar transistor having a base coupled to receive said control signal and having a collector and emitter, said collector of said second transistor coupled to said emitter of said first transistor and said collector of said first transistor coupled to receive said primary current;
   (c) a secondary current source coupled to said base of said first transistor;
   (d) a third bipolar transistor having a base, collector and emitter, said collector connected to the base of said first transistor and said emitter connected to the emitter of said second transistor; and
   (e) a zener diode having an anode coupled to the base of said third transistor and a cathode coupled to the collector of said second transistor, said zener diode having a breakdown voltage selected to be exceeded by the collector to emitter voltage of said second transistor immediately upon turn-off of said second transistor by said control signal.

10. A semiconductor device of claim 9 further comprising a second zener diode having a cathode coupled to the collector of said first transistor and having an anode coupled to the base of said third transistor.

* * * * *